(12) United States Patent
Takita et al.

(10) Patent No.: US 6,868,023 B2
(45) Date of Patent: Mar. 15, 2005

(54) SEMICONDUCTOR MEMORY DEVICE BASED ON DUMMY-CELL METHOD

(75) Inventors: Masato Takita, Kawasaki (JP);
Shinichi Yamada, Kawasaki (JP);
Masato Matsumiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/656,374

(22) Filed: Sep. 8, 2003

(65) Prior Publication Data

US 2004/0062088 A1 Apr. 1, 2004

(30) Foreign Application Priority Data

Sep. 13, 2002 (JP) ........................................ 2002-268762

(51) Int. Cl.[7] .............................. G11C 7/00; G11C 7/02
(52) U.S. Cl. ...................... 365/203; 365/210; 365/222
(58) Field of Search .............................. 365/203, 210, 365/222, 230.03, 207

(56) References Cited

U.S. PATENT DOCUMENTS

| | | | | |
|---|---|---|---|---|
| 4,262,342 A | * | 4/1981 | Tuan | 365/203 |
| 4,622,655 A | * | 11/1986 | Suzuki | 365/210 |
| 4,734,890 A | * | 3/1988 | Miyatake et al. | 365/210 |
| 4,794,571 A | * | 12/1988 | Uchida | 365/210 |
| 4,800,525 A | * | 1/1989 | Shah et al. | 365/210 |
| 4,831,591 A | * | 5/1989 | Imazeki et al. | 365/210 |
| 5,410,509 A | * | 4/1995 | Morita | 365/210 |
| 5,574,694 A | * | 11/1996 | von der Ropp | 365/210 |
| 5,612,912 A | * | 3/1997 | Gillingham | 365/230.03 |
| 6,111,802 A | * | 8/2000 | Kano et al. | 365/210 |
| 6,269,039 B1 | * | 7/2001 | Glossner et al. | 365/210 |

FOREIGN PATENT DOCUMENTS

| JP | 05028762 A | 2/1993 |
|---|---|---|
| JP | 11238387 A | 8/1999 |

* cited by examiner

*Primary Examiner*—Trong Phan
(74) *Attorney, Agent, or Firm*—Arent Fox, PLLC

(57) ABSTRACT

A semiconductor memory device includes a plurality of bit line pairs, each of which includes a first bit line and a second bit line, a plurality of memory cells which are coupled to said first bit line, and store electric charge in capacitors, a dummy cell which is coupled to a second bit line, and is charged with a predetermined potential, a sense amplifier which amplifies a potential difference between the first bit line and the second bit line, and a control circuit which charges said dummy cell with the predetermined potential only for a fixed time period.

8 Claims, 14 Drawing Sheets

SEMICONDUCTOR MEMORY DEVICE BASED ON DUMMY-CELL METHOD

CROSS-REFERENCE TO RELATED APPLICATIONS

The present application is based upon and claims the benefit of priority from the prior Japanese Patent Application No. 2002-268762 filed on Sep. 13, 2002, with the Japanese Patent Office, the entire contents of which are incorporated herein by reference.

BACKGROUND OF THE INVENTION

1. Field of the Invention

The present invention generally relates to semiconductor memory devices, and particularly relates to a semiconductor memory device that operates based on the dummy-cell method.

2. Description of the Related Art

In DRAMs (dynamic random access memories), a pair of bit lines are precharged to a middle potential between the power-supply potential and the ground potential, followed by reading data to one of the bit lines, and then amplifying a potential difference between the paired bit lines by use of a sense amplifier so as to sense the data. With the lowering of power-supply potential in recent years, it becomes increasingly difficult to generate a stable middle potential between the power-supply potential and the ground potential. Some technologies have thus been developed to use either a power-supply potential or a ground potential as a precharge potential. A method of reading data in such technologies includes a dummy-cell method.

FIG. 1 is a circuit diagram showing the peripheral circuitry of memory cells operating according to the dummy-cell method.

In the construction of FIG. 1, a pair of bit lines BL and /BL are connected to a sense amplifier 11. The amplification function of the sense amplifier 11 amplifies and holds a differential potential appearing between the bit lines BL and /BL. Each of the bit lines BL and /BL are coupled to memory cells, each of which includes a transistor 12 driven by a word-line potential and a memory cell capacitor 13 for storing data as electric charge. Word lines wl00 through wl(n) correspond to respective word addresses. Each of the bit lines BL and /BL is connected to a single dummy cell. The dummy cell includes a transistor 14 driven by a dummy word line (dwl0C, dwl01), a dummy cell capacitor 15 for storing data as electric charge, and a transistor 16 for precharging the dummy cell capacitor 15. When the transistor 16 becomes conductive by a dummy cell precharging line dcp, a potential vdc is supplied to the dummy cell capacitor 15.

FIG. 2 is a timing chart for explaining a data read operation according to the dummy-cell method.

A bit line bl (collectively representing both of the bit lines BL and /BL) is precharged to a power-supply potential, for example. At timing t1, the dummy cell precharging line dcp is set to HIGH to disconnect the dummy cell capacitor 15 from the potential vdc, thereby finishing precharging of the data-storage node of the dummy cell. At timing t2, the dummy word line dwl is activated (changed to LOW) so as to change the potential of one of the bit lines according to the potential of the dummy cell capacitor 15. At timing t3, the word line wl is activated (changed to LOW) so as to change the potential of the other bit line according to the potential of the memory cell capacitor 13. Timing t2 and timing t3 may be reversed in order, or may be simultaneous. The sense amplifier 11 amplifies a minute potential difference between the bit lines, thereby sending the data.

The bits lines are precharged to the power-supply potential, so that a bit line on which data appears does not exhibit a potential change when HIGH data is being read. In order to achieve proper data reading even in such a case, a potential on the other bit line is dropped by use of a dummy cell, and a resulting differential potential is then amplified to sense the data. The drop of a potential on the bit line caused by the dummy cell needs to be set such that a drop from the power-supply potential is sufficient for sensing of HIGH data, and such that the drop is sufficiently smaller, for sensing of LOW data, than a potential drop on the other bit line that is caused by the LOW data. The dummy cell capacitance is set smaller than the memory cell capacitance. With this provision, a potential difference is generated even when data having the same potential are stored in the dummy cell and the memory cell.

A DRAM suffers gradual loss of data stored in the memory cell capacitor with elapsing of time. Because of this, there is a need to perform constant rewriting operations (refresh operations) for the purpose of retaining the stored data. The dummy cell is disconnected from the bit line at timing t4 by deactivation of the dummy word line dwl. At timing t5, then, the dummy cell precharging line dcp is activated (changed to LOW), thereby writing the set potential vdc. This is referred to as dummy-cell precharge.

Conventionally, the transistor 16 is kept conductive while there is no access to a cell block, thereby constantly writing the set potential to the data storage node of the dummy cell. This is because there was a belief that it is preferable to constantly apply the set potential during the period of no access since the small dummy cell capacitor suffers high-speed loss of stored electric charge.

The shorter the intervals of access to the bit lines, the shorter the precharge time of the dummy cell becomes. This makes it difficult to set a sufficient set potential to the dummy cell. If the access intervals are sufficiently long, on the other hand, a sufficient precharge time ensures that the data storage node of the dummy cell is set to the desired set potential. In this manner, the actual potential of the dummy cell varies, depending on the intervals at which access is made to the bit lines. As a result, the reference potential for data read operation fluctuates, depending on the access intervals, thereby giving rise to a problem in that a data-read margin is reduced.

Accordingly, there is a need for a semiconductor memory device operating based on the dummy-cell method in which a stable read operation is achieved regardless of access intervals.

List of Related Documents

1. Japanese Patent Application Publication No. 5-28762
2. Japanese Patent Application Publication No. 11-238387

SUMMARY OF THE INVENTION

It is a general object of the present invention to provide a semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages in accordance with the purpose of the invention, the invention provides a semiconductor memory device, including a plurality of bit line pairs, each of which includes a first bit line and a second bit line, a plurality of memory cells which are coupled to said first bit line, and store electric charge in capacitors, a dummy cell which is coupled to a second bit line, and is charged with a predetermined potential, a sense amplifier which amplifies a potential difference between the first bit line and the second bit line, and a control circuit which charges said dummy cell with the predetermined potential only for a fixed time period.

The semiconductor memory device described above finishes the precharging of the dummy cell after a predetermined time period, so that the time length of precharging of the dummy cell stays constant regardless of the length of access intervals. This achieves a stable read operation irrespective of access intervals.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 3:
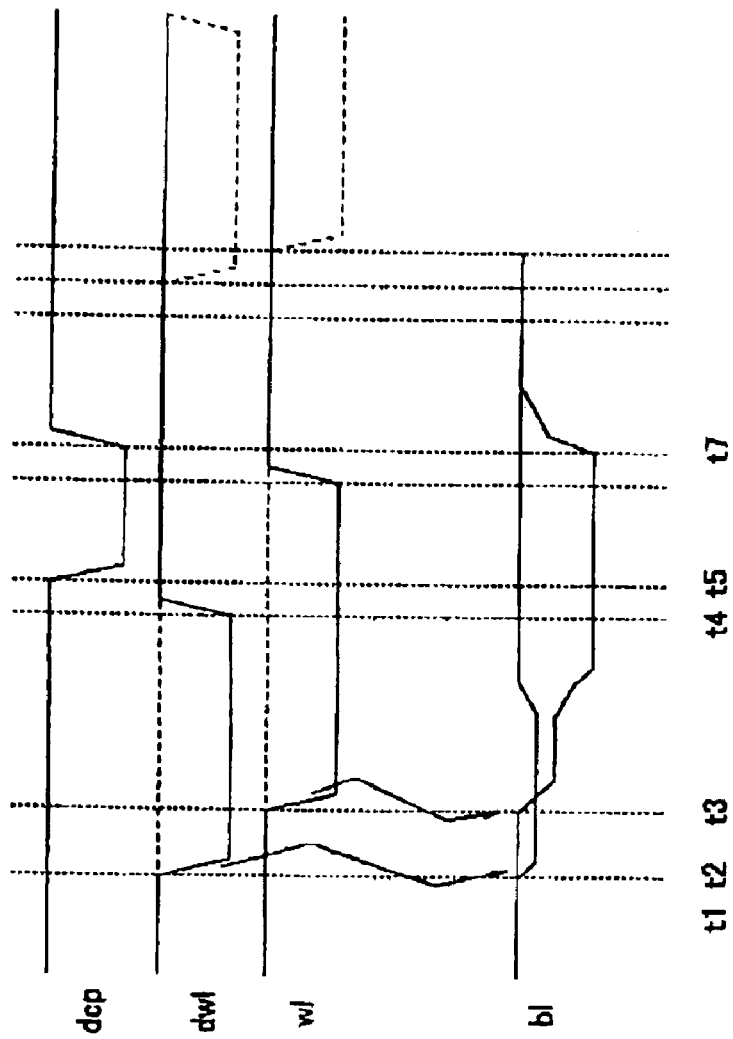
FIG. 3 is a timing chart for explaining the fundamental operation of dummy-cell precharge according to the present invention.

FIG. 3 is a timing chart for explaining the fundamental operation of dummy-cell precharge according to the present invention.

Figure 1:
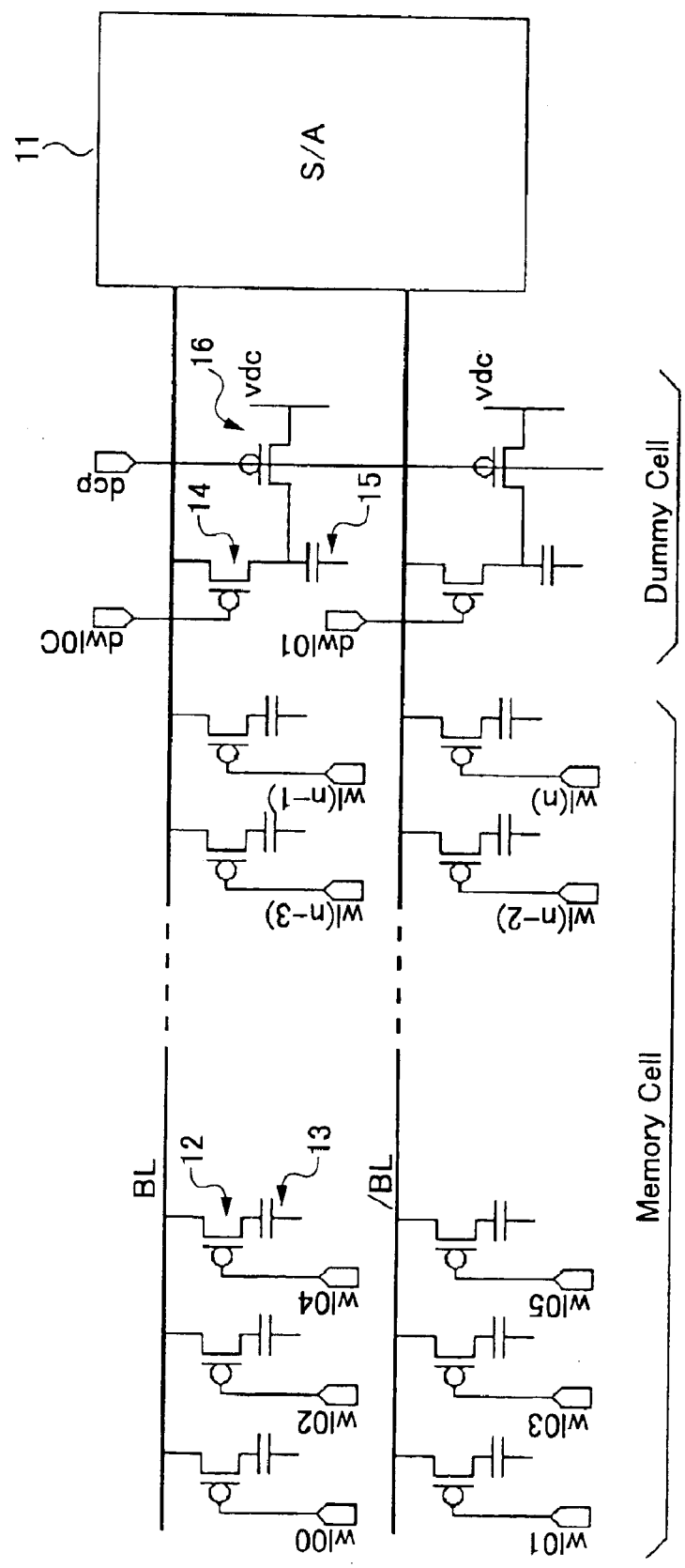
FIG. 1 is a circuit diagram showing the peripheral circuitry of memory cells operating according to the dummy-cell method.
Figure 2:
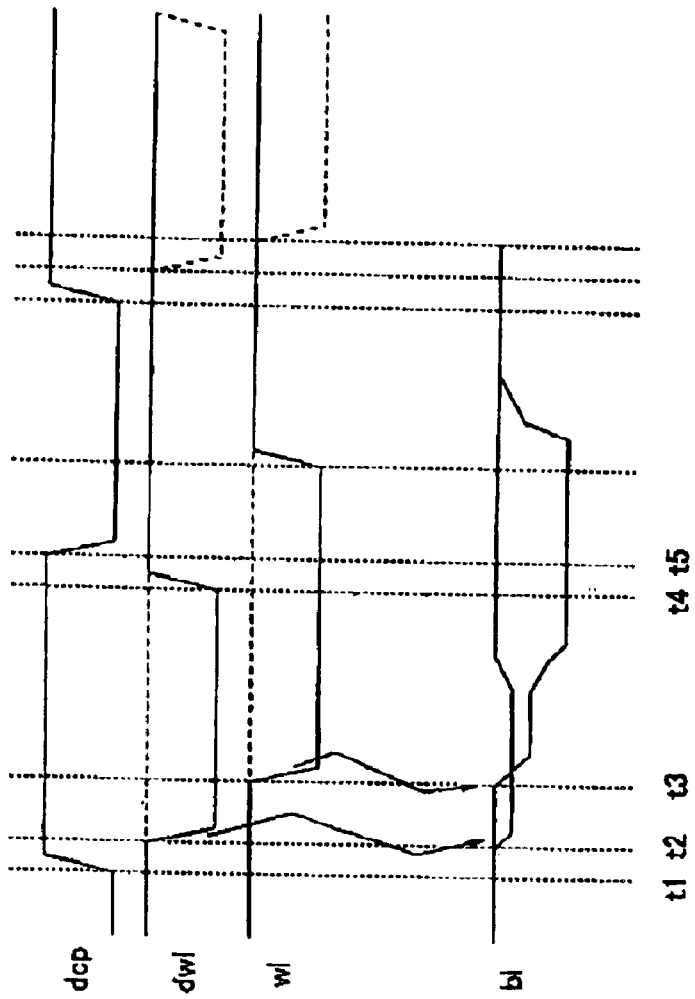
FIG. 2 is a timing chart for explaining a data read operation according to the dummy-cell method.

In the timing chart of the related-art read operation as shown in FIG. 2, the dummy cell precharging line dcp is kept in an activated state for precharging of the dummy cell until timing t1, which comes immediately prior to timing t2, at which the dummy word line dwl is activated for the start of access operation. Further, the dummy cell precharging line dcp is activated to start precharging the dummy cell at timing t5, which comes immediately after timing t4, at which the dummy word line dwl is deactivated. Thereafter, the precharging of the dummy cell continues until next access is performed.

In the dummy precharging operation of the invention as shown in FIG. 3, on the other hand, the precharging of the dummy cell comes to an end by the deactivation of the dummy cell precharging line dcp at timing t7, which marks an end of a predetermined time period after the start of precharging the dummy cell. In this manner, the present invention finishes the precharging of the dummy cell after the predetermined time period, so that the time length of precharging of the dummy cell stays constant regardless of the length of access intervals. The operating timing shown in FIG. 3 equally applies in the case of read operations as well as in the case of memory cell precharge operations.

In the present invention, the precharging of the dummy cell may be performed simultaneously with the precharging of memory cells, or may be performed separately from the precharging of memory cells.

Figure 4:
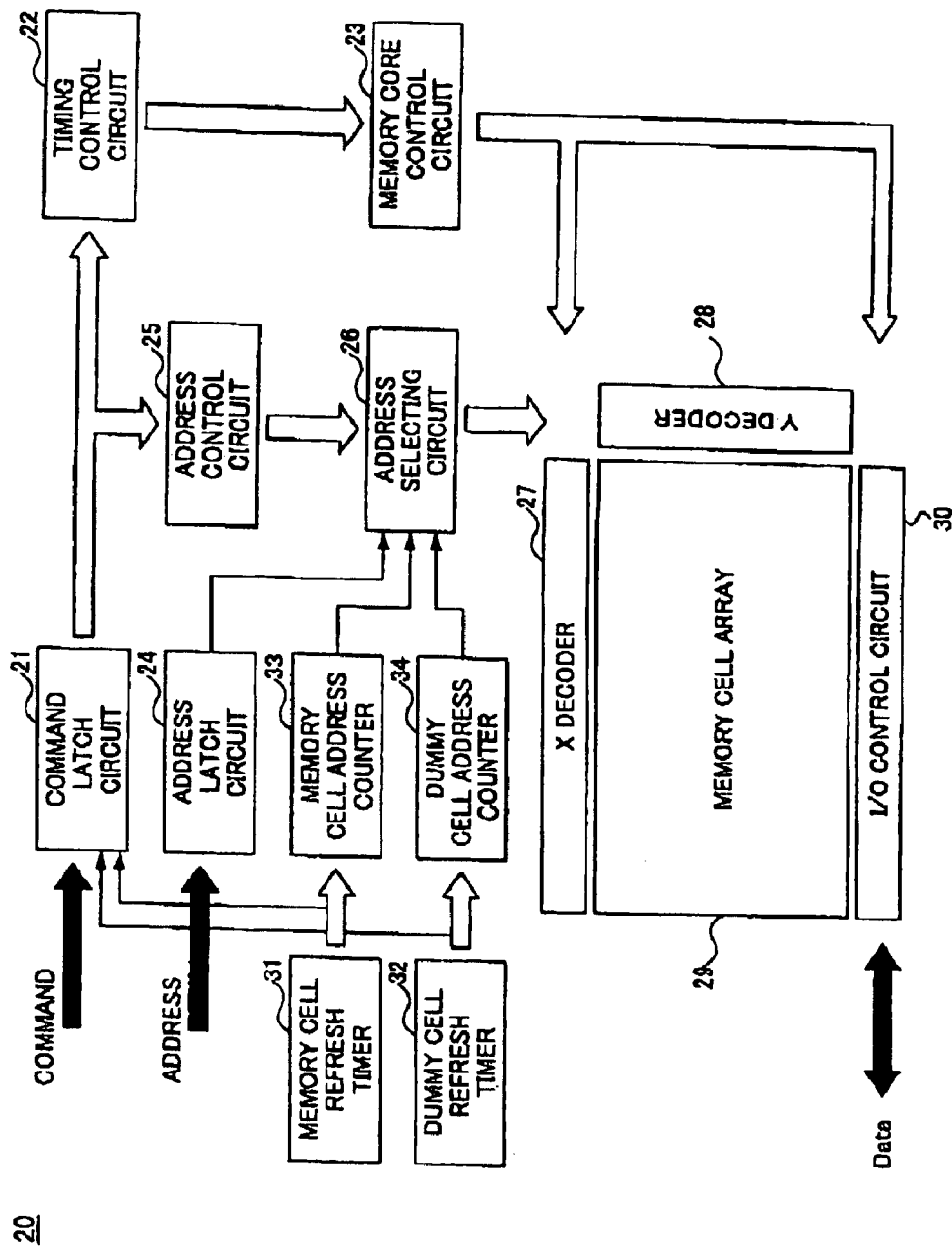
FIG. 4 is a block diagram showing a first embodiment of a semiconductor memory device according to the present invention.

FIG. 4 is a block diagram showing a first embodiment of a semiconductor memory device according to the present invention.

A semiconductor memory device 20 of FIG. 4 includes a command latch circuit 21, a timing control circuit 22, a memory core control circuit 23, an address latch circuit 24, an address control circuit 25, an address selecting circuit 26, an X decoder 27, a Y decoder 28, a memory cell array 29, an I/O control circuit 30, a memory cell refresh timer 31, a dummy cell refresh timer 32, a memory cell address counter 33, and a dummy cell address counter 34.

The command latch circuit 21 receives commands from an exterior of the device, and latches them. The command latch circuit 21 decodes the latched commands, and controls the timing control circuit 22 and the address control circuit 25 according to the decoding results. The timing control circuit 22 generates various timing signals under the control of the command latch circuit 21, and supplies the generated timing signals to the memory core control circuit 23. The memory core control circuit 23 controls the X decoder 27, the Y decoder 28, the memory cell array 29, the I/O control circuit 30, etc., according to the received timing signals.

The address latch circuit 24 receives an address from the exterior of the device, and latches the received address for provision to the address selecting circuit 26. The address control circuit 25 controls the address selecting circuit 26 under the control of the command latch circuit 21. The address selecting circuit 26 selects one of the external address from the address latch circuit 24, a memory cell refresh address from the memory cell address counter 33, and a dummy cell refresh address from the dummy cell address counter 34. The selected address is supplied to the X decoder 27 and the Y decoder 28.

The X decoder 27 decodes an X address (row address) supplied from the address selecting circuit 26, and selectively activates a specified word line. The address selecting circuit 26 decodes a Y address (column address) supplied from the address selecting circuit 26, and selectively activates a specified column selecting line. This achieves access to a memory cell of the memory cell array 29 at the specified word and column.

The I/O control circuit 30 supplies data to the exterior of the device as it is read from the memory cell array 29. The I/O control circuit 30 also supplies data to the memory cell array 29 as it is supplied from the exterior of the device.

The memory cell refresh timer 31 determines the refresh timing of memory cells. The memory cell refresh timer 31 measures a predetermined time period to order the refreshing of memory cells at the predetermined intervals. In response to the refresh instruction from the memory cell refresh timer 31, the memory cell address counter 33 generates refresh addresses, which are then supplied to the address selecting circuit 26.

The dummy cell refresh timer 32 determines the refresh timing of dummy cells. The dummy cell refresh timer 32 measures a predetermined time period to order the refreshing of dummy cells at the predetermined intervals. In response to the refresh instruction from the dummy cell refresh timer 32, the dummy cell address counter 34 generates refresh addresses, which are then supplied to the address selecting circuit 26.

Figure 5:
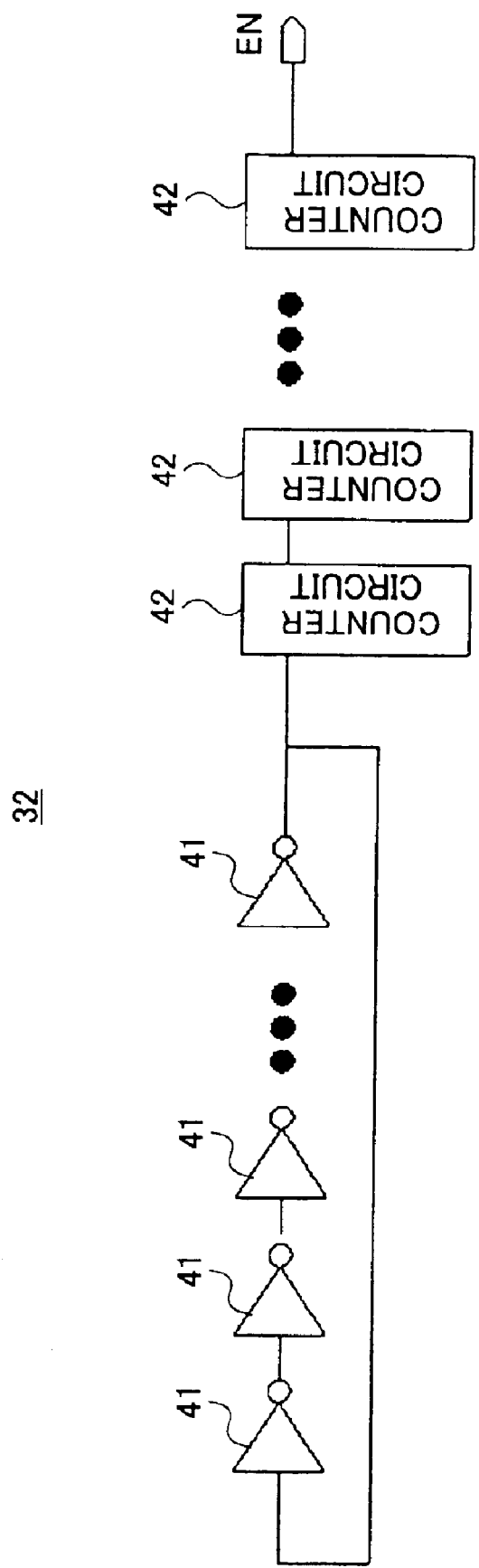
FIG. 5 is a circuit diagram showing a general construction of a dummy cell refresh timer.

The dummy cell refresh timer 32 is a timer circuit which measures rewrite intervals required for stable operations based on the characteristics of dummy cells and the amount of stored electric charge (written potential). FIG. 5 is a circuit diagram showing a general construction of the dummy cell refresh timer 32.

The dummy cell refresh timer 32 of FIG. 5 includes a plurality of inverters 41 and a plurality of counter circuits 42. The inverters 41 are connected in series, with the head end and the tail end being connected together, thereby constituting a ring oscillator. This ring oscillator oscillates at a predetermined frequency, and the counter circuits 42 divide the frequency of the oscillating signal. One counter circuit 42 achieves ½-frequency division. Adjustment of the number of the counter circuits 42 can control the cycle of the dummy cell refresh timer 32. Alternatively, the oscillating frequency of the ring oscillator may be controlled by adjusting the number of the inverters 41.

Since the memory cells and the dummy cells have different capacitances and characteristics, the refresh intervals required for retaining data in the memory cells may differ from the refresh intervals required for retaining the set potential in the dummy cells. Accordingly, the memory cell refresh timer 31 and the memory cell address counter 33 may preferably generate different refresh intervals.

The dummy cell refresh timer 32 outputs a signal EN, which is supplied to the command latch circuit 21 a the dummy cell address counter 34. Having received the signal EN, the command latch circuit 21 controls the address selecting circuit 26 through the address control circuit 25. In response the address selecting circuit 26 selects the dummy cell refresh address from the dummy cell address counter 34. The dummy cell address counter 34 successively increments the dummy cell refresh address, resulting in the refreshing of dummy cells being successively performed at specified addresses.

Figure 6:
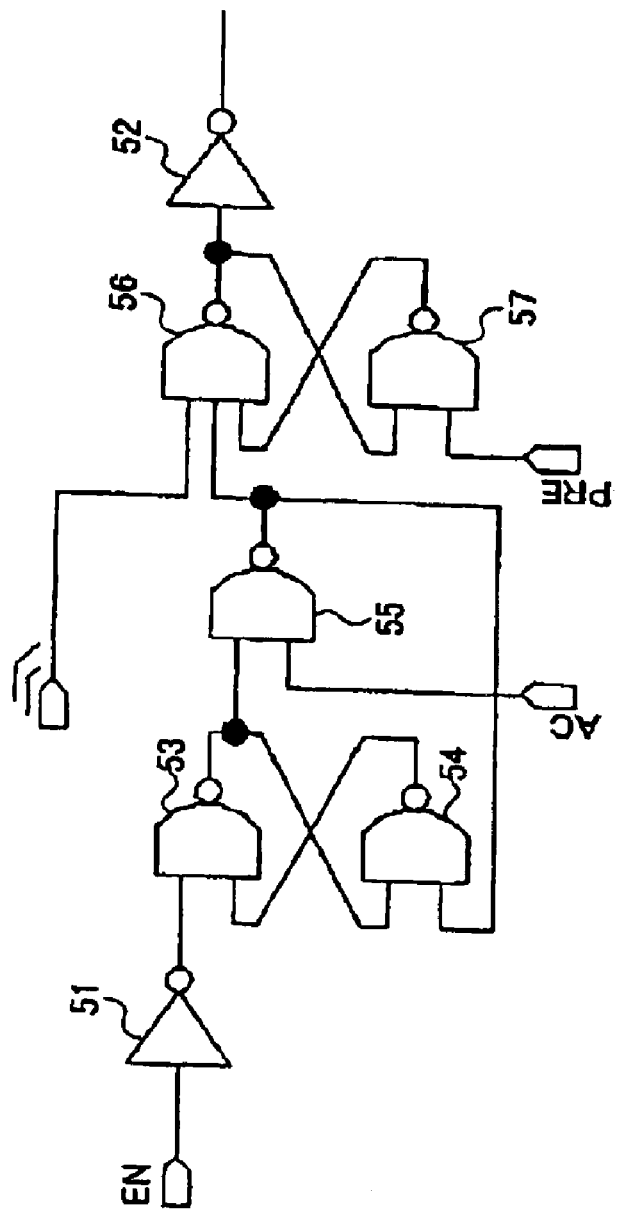
FIG. 6 is a circuit diagram showing an example of a circuit that blocks a signal EN according to an access state.

When the semiconductor memory device is being accessed, the command latch circuit 21 needs to block the signal EN at its receiving node where the signal EN is received from the dummy cell refresh timer 32. FIG. 6 is a circuit diagram showing an example of the circuit that blocks the signal EN according to the access state.

The circuit of FIG. 6 includes inverters 51 and 52 and NAND gates 53 through 57. The NAND gates 53 and 54 together constitute a first latch, and the NAND gates 56 and 57 together make up a second latch. The NAND gate 55 is the circuit portion that controls whether to block the signal EN. The NAND gate 55 receives, at one input, the signal EN from the first latch, and receives, at the other input, a signal AC indicative of an access state of the memory device. The signal AC is LOW at the time of access operations.

The first latch temporarily store the request signal EN.

When the signal is asserted, the start of precharging of dummy cells should be delayed until the end of an access operation if the memory is currently accessed. Since the signal AC is LOW in the access state, the signal EN does not pass through the NAND gate 55. In this case, the state of the signal EN is held by the first latch.

When access to the memory comes to an end, the signal AC input to the NAND gate 55 changes to HIGH, resulting in the signal EN being latched by the second latch through the NAND gate. The signal EN is further output the inverter 52. The command latch circuit 21 receives a precharge instruction for dummy cells. Here, a signal PRE serves to reset the second latch by temporarily changing to LOW at the end of an access operation.

Figure 7:
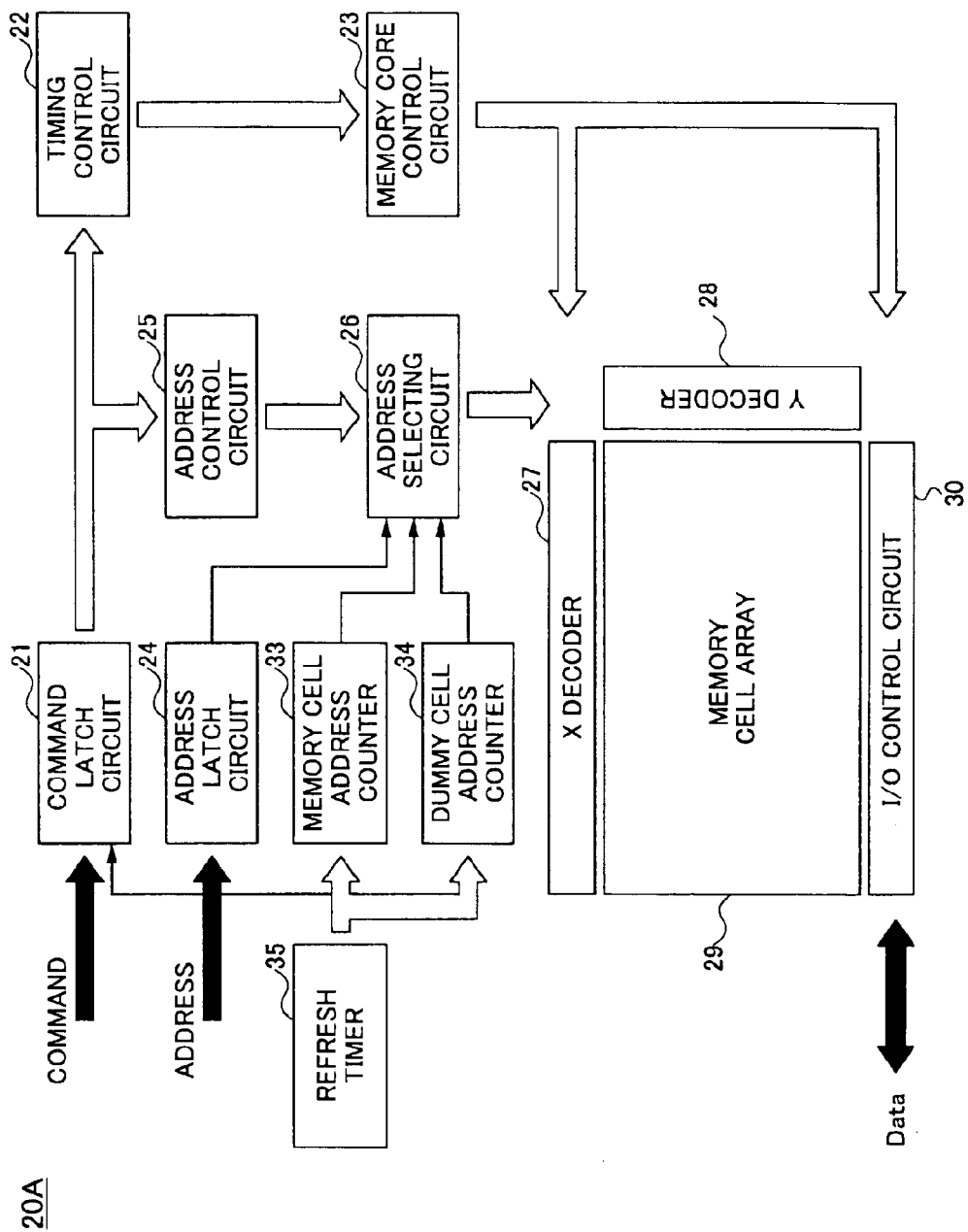
FIG. 7 is a block diagram showing a second embodiment of a semiconductor memory device according to the present invention.

FIG. 7 is a block diagram showing a second embodiment of a semiconductor memory device according to the present invention. In FIG. 7, the same elements as those of FIG. 4 are referred to by the same numerals, and a description thereof will be omitted.

Figure 8:
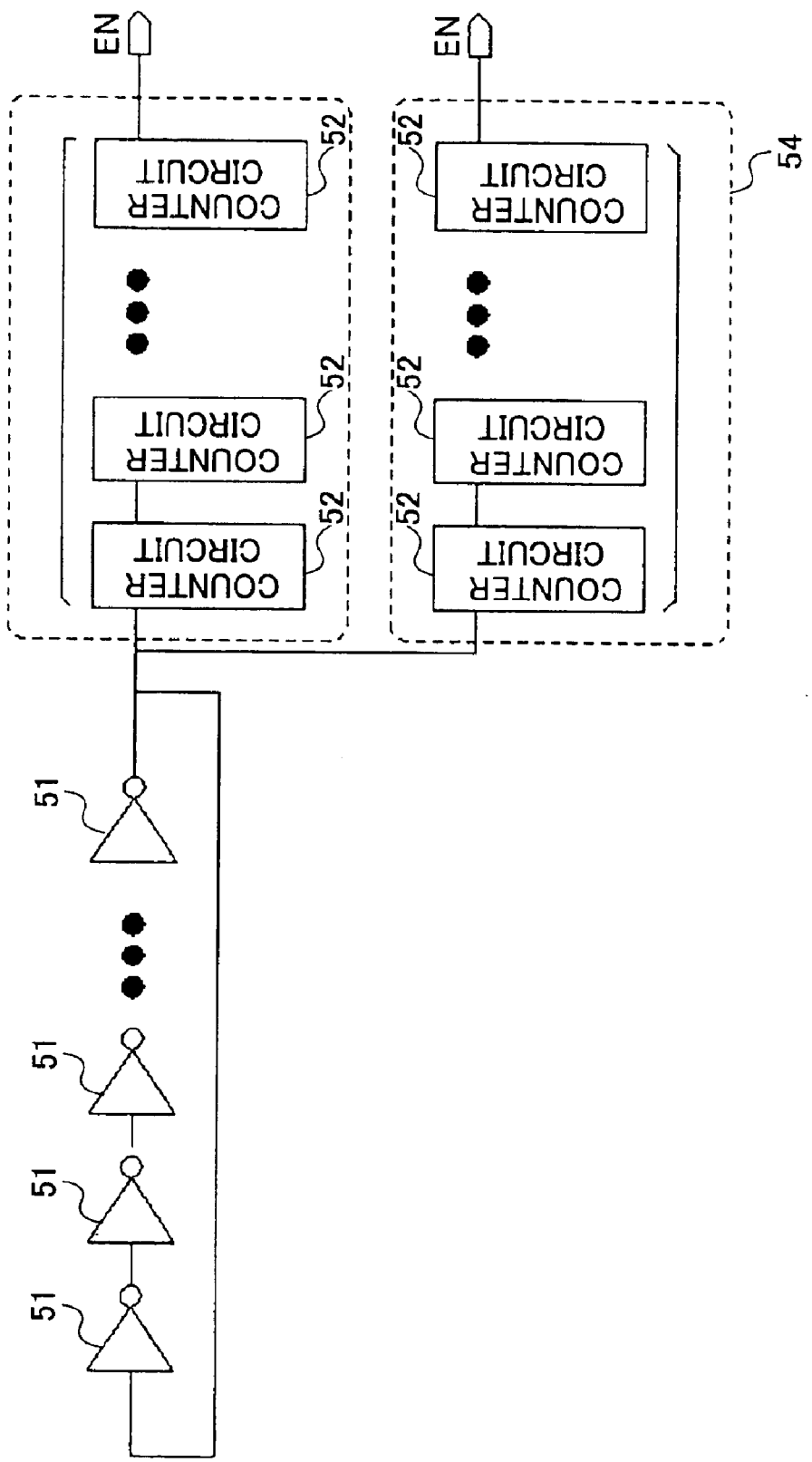
FIG. 8 is a circuit diagram showing an example of a refresh timer.

A semiconductor memory device 20A of FIG. 7 includes a refresh timer 35, which replaces the memory cell refresh timer 31 and the dummy cell refresh timer 32 by combining their functions in the semiconductor memory device 20 of the first embodiment shown in FIG. 4. FIG. 8 is a circuit diagram showing an example of the refresh timer 35.

The refresh timer 35 of FIG. 8 includes a plurality of inverters 51, a dummy cell counter unit 53, and a memory cell counter unit 54. The dummy cell counter unit 53 and the memory cell counter unit 54 each include a plurality of counter circuits 52. The inverters 51 are connected in series, with the head end and the tail end being connected together, thereby constituting a ring oscillator. This ring oscillator oscillates at a predetermined frequency, and the dummy cell counter unit 53 and the memory cell counter unit 54 divide the frequency of the oscillating signal. One counter circuit 52 achieves ½-frequency division. Adjustment of the number of the counter circuits 52 can control the memory cell refresh cycle and the dummy cell refresh cycle. In detail, there may be a need to set the intervals of the refresh instruction signal EN for dummy cells shorter than the intervals of the refresh instruction signal for memory cells. To this end, the of the counter circuits 52 in the dummy cell counter unit 53 may be set to n−i whereas the number of the counter circuits 52 in the memory cell counter unit 54 is set to n.

The second embodiment as described above consolidates two timer circuits into one, thereby reducing chip size and production costs.

Figure 9:
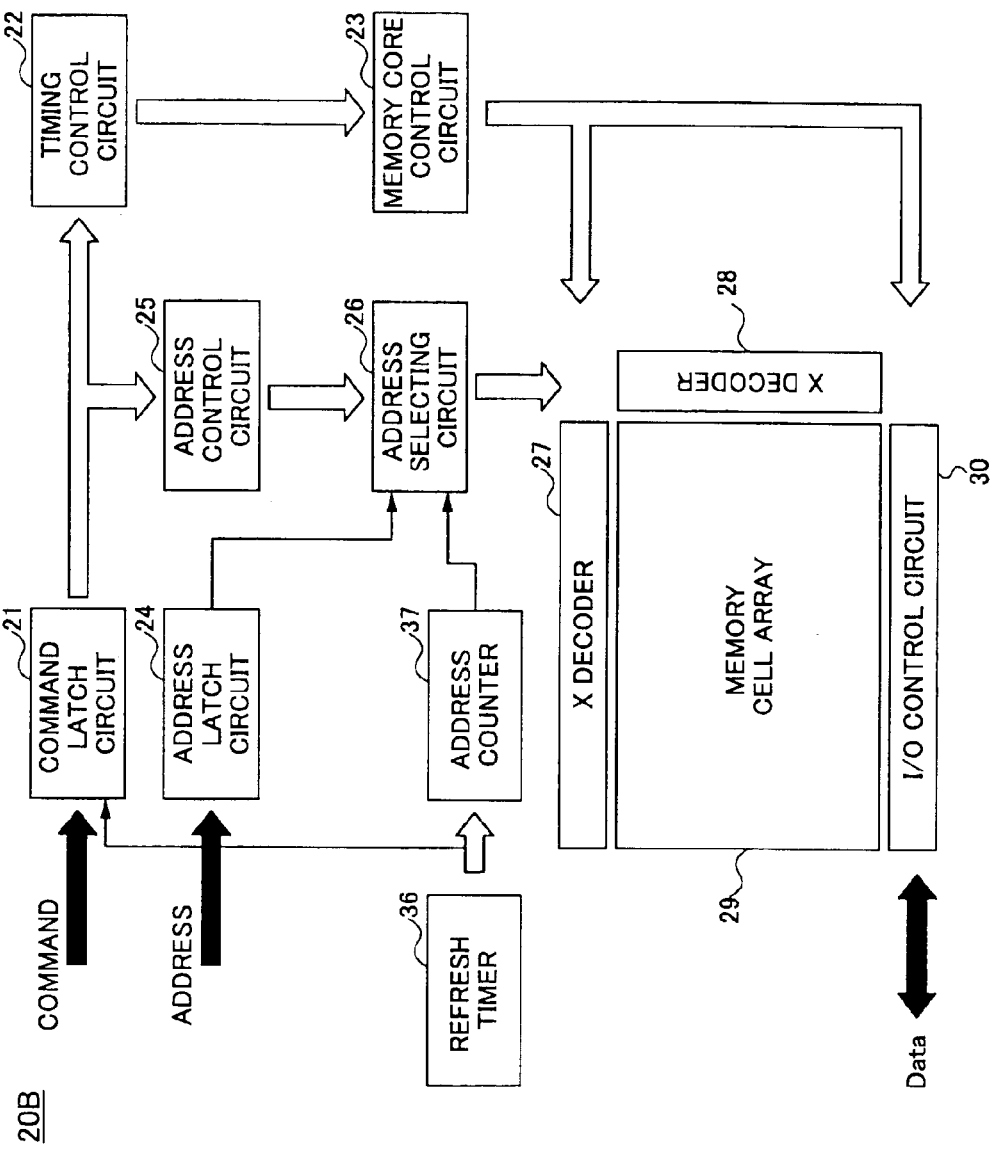
FIG. 9 is a block diagram showing a third embodiment of a semiconductor memory device according to the present invention.

FIG. 9 is a block diagram showing a third embodiment of a semiconductor memory device according to the present invention. In FIG. 9, the same elements as those of FIG. 4 are referred to by the same numerals, and a description thereof will be omitted.

A semiconductor memory device 20B of FIG. 9 includes a refresh timer 36, which replaces the memory cell refresh timer 31 and the dummy cell refresh timer 32 by combining their functions in the semiconductor memory device 20 of the first embodiment shown in FIG. 4. Further, the memory cell address counter 33 and the dummy cell address counter 34 are consolidated into an address counter 37.

In the third embodiment, the timer circuit for measuring refresh intervals and the address counter circuit are shared by the dummy cell system and the memory cell system. With this provision, the refreshing of memory cells is performed at addresses specified by the address counter 37, and, at the same time, the refreshing of corresponding dummy cells is performed. Namely, when memory cells are refreshed, the dummy cell is also refreshed at the same operation cycle as shown in the operation timing of FIG. 3.

Figure 10:
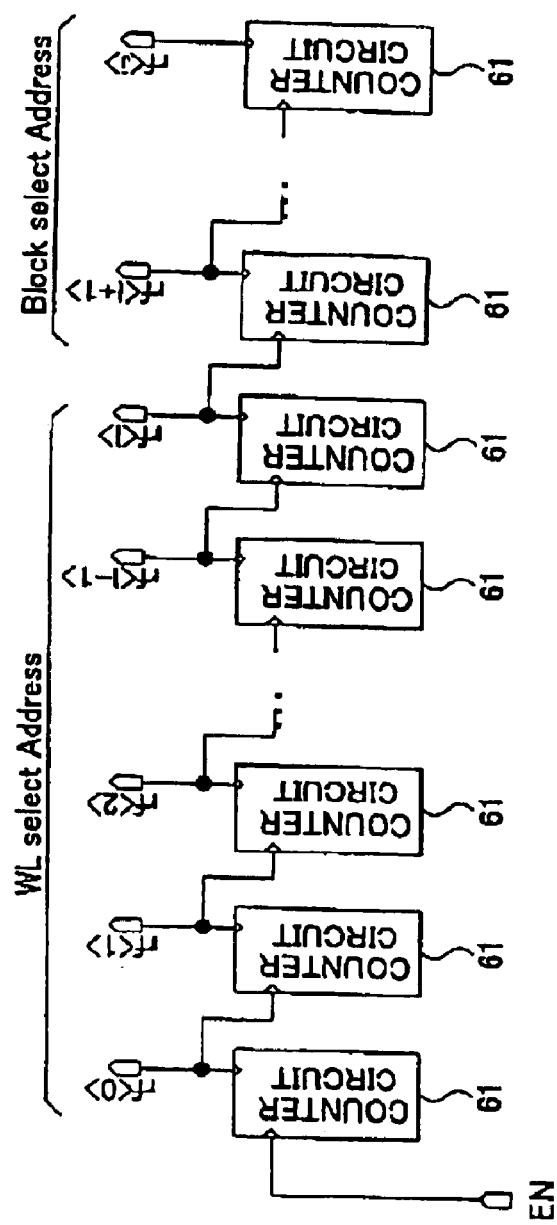
FIG. 10 is a circuit diagram showing an example of an address counter.

FIG. 10 is a circuit diagram showing an example of the address counter 37.

The address counter 37 of FIG. 10 includes a plurality of counter circuits 61 connected in a cascade series, with the counter circuit 61 at the top receiving the instruction signal EN from the refresh timer 36. The outputs of the counter circuits 61 obtained in parallel are supplied as a refresh address. The refresh address is counted up one by one each time the instruction signal EN is input. In this configuration, the low-order (l+1) bits rf<0> through rf<l> represent a word line selecting address WL select Address, and the high-order (i−l) bits rf<l+1> through rf<i> represent a block selecting address Block select Address. Namely, a shift to the next block is made when the refresh operation is completed with respect to all the word addresses in a given block by refreshing word lines one after another. In the next block, word lines will then be refreshed one after another.

Figure 11:
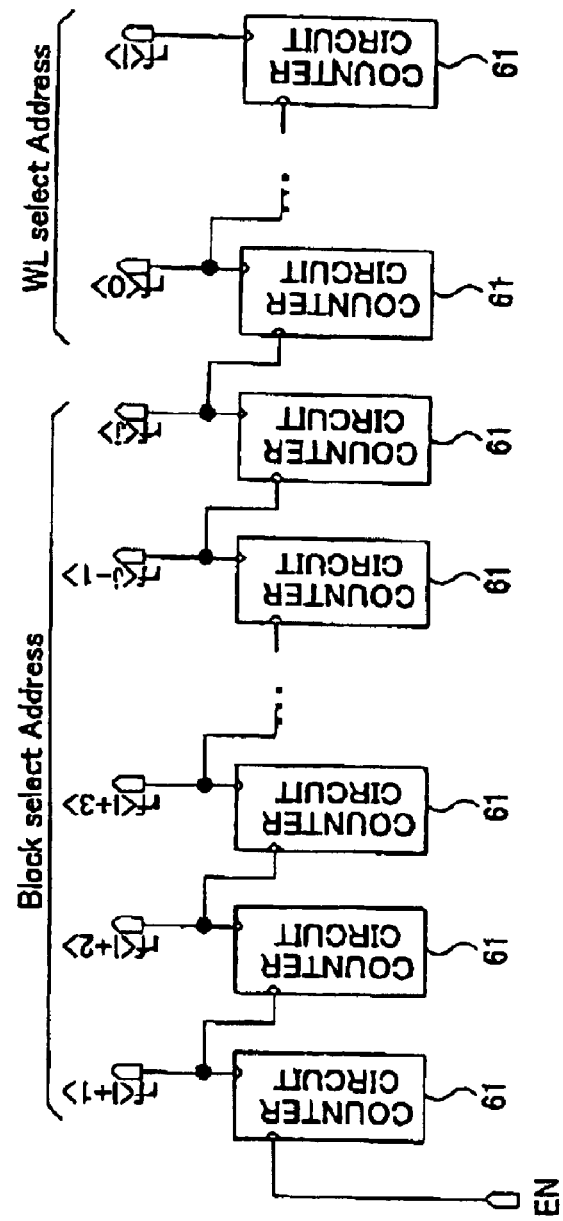
FIG. 11 is a circuit diagram showing another example of the address counter.

FIG. 11 is a circuit diagram showing another example of the address counter 37.

The address counter 37 of FIG. 11 includes the counter circuits 61 connected in cascade series as in the construction of FIG. 10, with the outputs of the counter circuits 61 being obtained in parallel as a refresh address. In this configuration, however, the low-order (i−l) bits rf<l+1> through rf<j> represent a block selecting address Block select Address, and the high-order (l+1) bits rf<0> through rf<l> represent a word line selecting address WL select Address. In this configuration, thus, a shift to the next block is made when a given word address is refreshed in a given block, followed by the same word address being refreshed in the next block. This is repeated until the same word address is refreshed in all the blocks. Then, a return to the first block is made, and the next word address is refreshed from the first block to the last block, which is then repeated.

Here, the term "block" refers to an area corresponding to each sense amplifier (each sense amplifier block).

Figure 12:
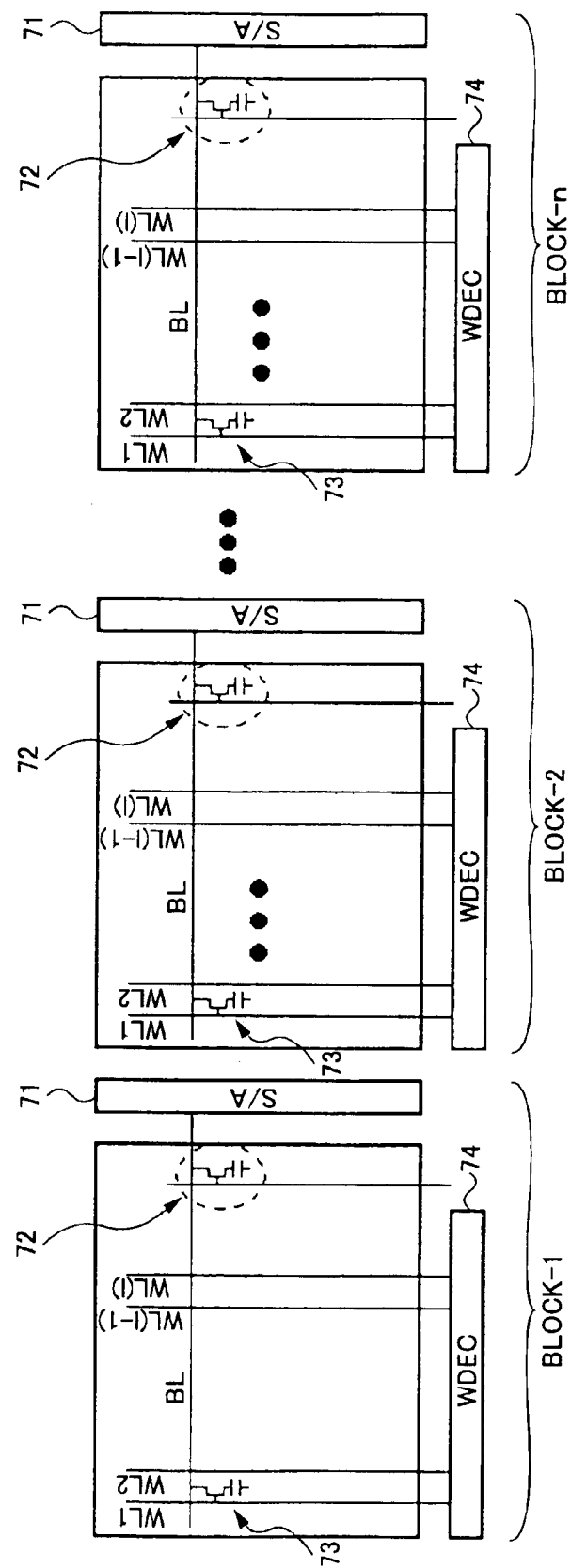
FIG. 12 is an illustrative drawing showing the block configuration of a memory cell array.

FIG. 12 is an illustrative drawing showing the block configuration of a memory cell array.

In an example of FIG. 12, the semiconductor memory device is comprised of n blocks, i.e., block-1 to block-n. Each block includes a sense amplifier (sense amplifier block) 71, a dummy cell 72, a memory cell 73, a word decoder (X decoder) 74, word lines WL1 through WL(i), and a bit line BL. For the sake of simplicity of illustration, the bit line BL, the dummy cell 72, and the memory cell 73 are shown as if only one of each is provided. In reality, however, a plurality of bit lines are provided, and a single dummy cell 72 and a plurality of memory cells 73 are connected to each of the bit lines. As shown in FIG. 12, one block corresponds to one sense amplifier 71. Each bit line extending from the sense amplifier 71 is connected to a corresponding dummy cell 72. Accordingly, each time a given word address is refreshed, the corresponding dummy cell 72 is refreshed once.

When word line selecting addresses are counted up first as in the case of FIG. 10, the i word lines of the selected block are successively activated for refresh operations, followed by moving on to the next block. That is, a refresh operation is repeated i times on the same dummy cells before a refresh operation for next dummy cells (i.e., dummy cells in the next block) is performed. In other words, a new set of dummy cells are refreshed after the memory cells are refreshed i times.

When block selecting addresses are counted up first as in the case of FIG. 11, a word line of a selected address is activated for refresh operation in the first block, and, then, a word line of the same selected address is activated in the second block. After the word lines of the selected address are activated in all the blocks, a return to the first block is made, with the activation of a word line of the next selected address. Accordingly, a new dummy cell is refreshed each time memory cells are refreshed.

As can be understood from the above description, the configuration that counts up the block selecting address first as in the case of FIG. 11 is preferable in that it achieves a shorter refresh interval for each dummy cell. In such a configuration, a time period required for refreshing memory cells n times is roughly equal to the refresh interval of each dummy cell where n is the number of blocks. When word line selecting addresses are counted up first as in the case of FIG. 10, the time period required for refreshing memory cells i(n−1) times is roughly equal to the refresh interval of each dummy cell where n is the number of blocks and i is the number of word lines in each block.

Figure 13:
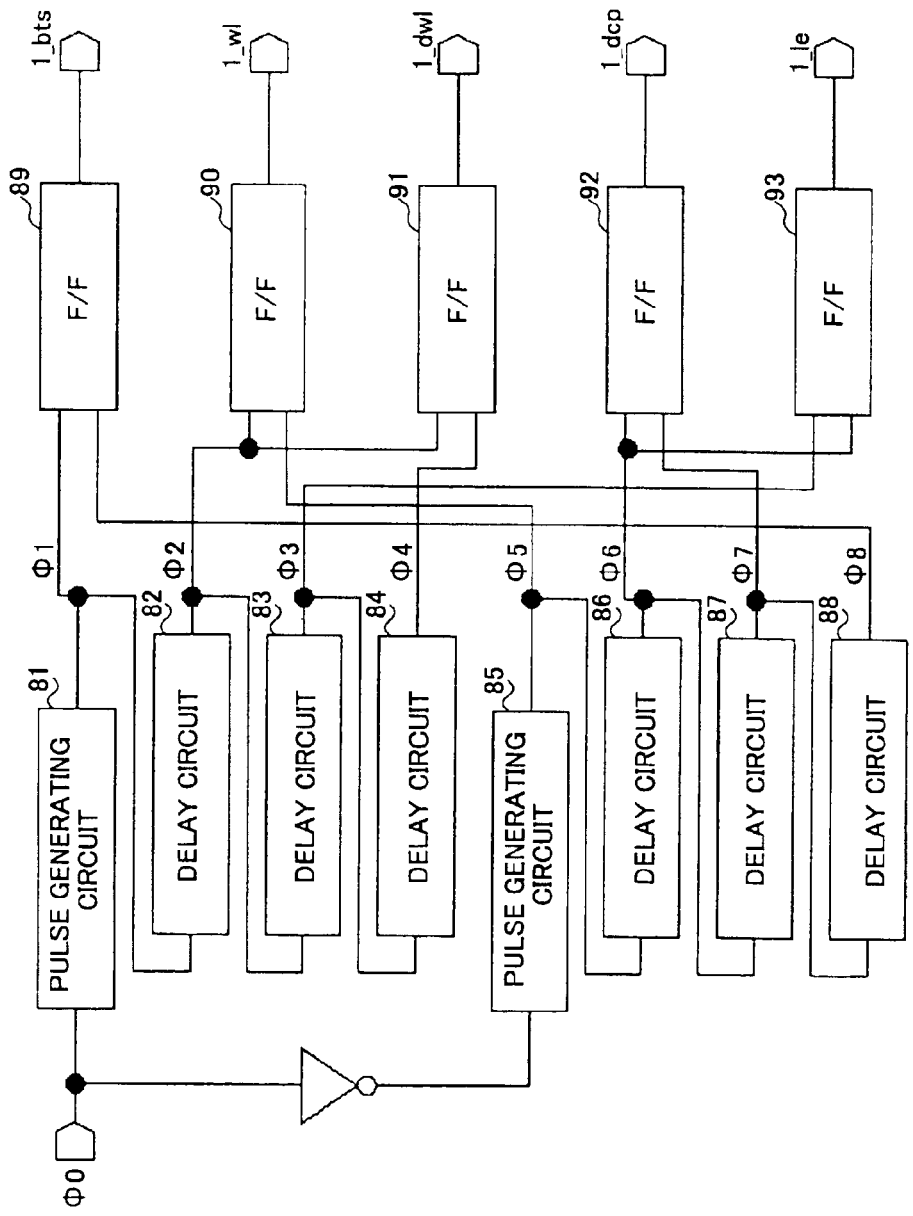
FIG. 13 is a circuit diagram of a circuit that generates signals for controlling word lines, dummy word lines, dummy cell precharging lines, and sense amplifiers.

FIG. 13 is a circuit diagram of a circuit that generates signals for controlling word lines, dummy word lines, dummy cell precharging lines, and sense amplifiers. The circuit of FIG. 13 is provided in the memory core control circuit 23 shown in FIG. 9, for example.

Figure 14:
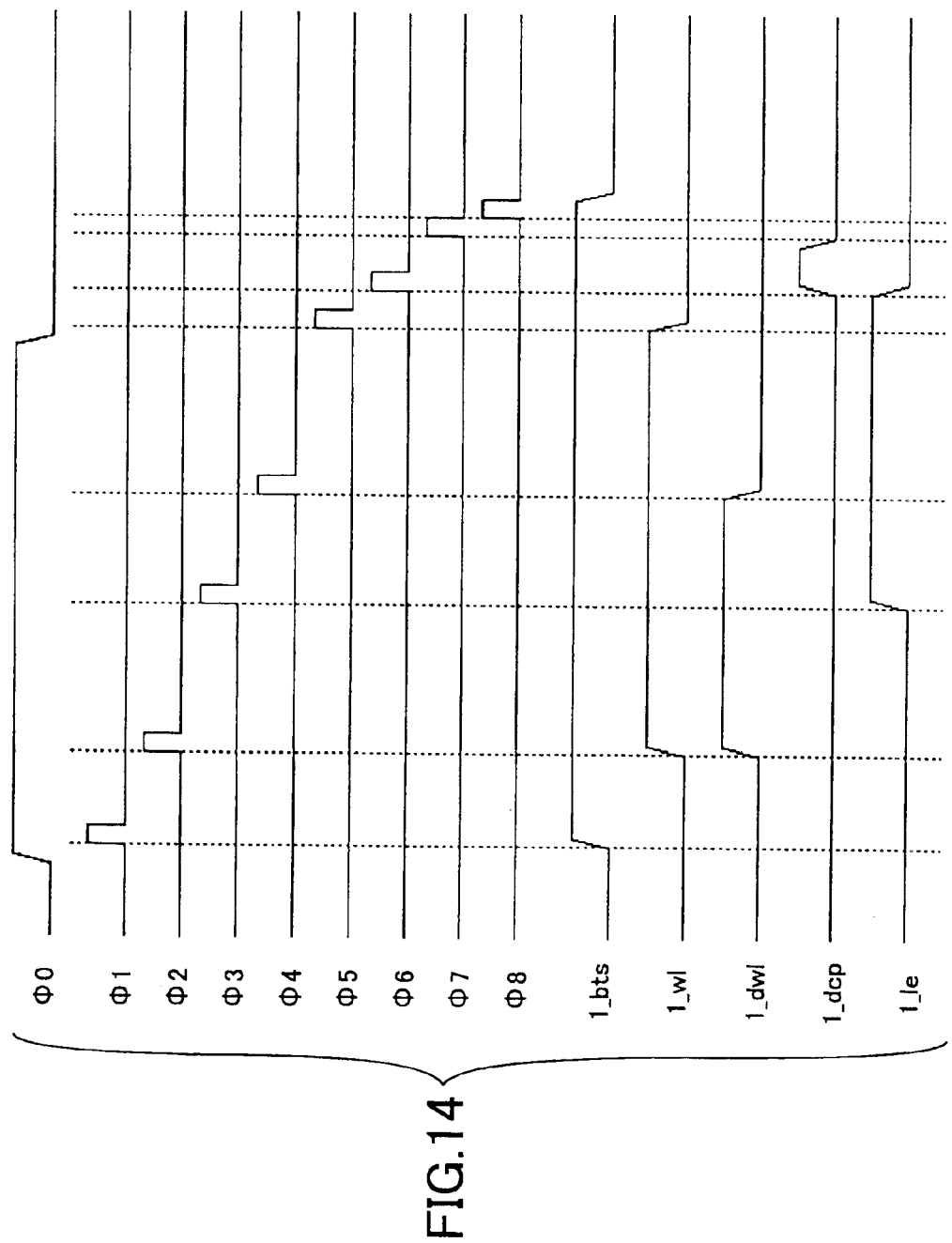
FIG. 14 is a timing chart for explaining the operation of the circuit of FIG. 13.

The circuit of FIG. 13 includes a pulse generating circuit 81, delay circuits 82 through 84, a pulse generating circuit 85, delay circuits 86 through 88, and flip-flops 89 through 93. FIG. 14 is a timing chart for explaining the operation of the circuit of FIG. 13.

A signal $\phi0$ shown in FIG. 14 is generated by the timing control circuit 22 of FIG. 9, for example. In response to a positive transition of the signal $\phi0$, the pulse generating circuit 81 generates a pulse signal $\phi1$. The pulse signal $\phi1$ is successively delayed by the delay circuits 82 through 84, thereby generating pulse signals $\phi2$ through $\phi4$. In response to a negative transition of the signal $\phi0$, the pulse generating circuit 85 generates a pulse signal $\phi5$. The pulse signal $\phi5$ is successively delayed by the delay circuits 86 through 88, thereby generating pulse signals $\phi6$ through $\phi8$.

The flip-flops 89 through 93 are set by corresponding ones of the pulse signals $\phi1$ through $\phi8$, and are reset by other ones of the pulse signals $\phi1$ through $\phi8$. As a result, the flip-flops 89 through 93 generate a bit-line-precharge-control-timing signal 1 bts (no precharge during the HIGH period), a word-line-control-timing signal 1 wl (activation of word lines during the HIGH period), a dummy-word-line-control-timing signal 1 dwl (activation of dummy word lines during the HIGH period), a dummy-cell-precharge-controltiming signal 1 dcp (precharge during the HIGH period), and a sense-amplifier-control-timing signal 1 le (activation of sense amplifiers during the HIGH period), respectively. Based on these signals, the precharging of memory cells (or read operations) and the precharging of dummy cells are performed in a similar manner as shown in the operation timing of FIG. 3. With this provision, the present invention controls the precharging of dummy cells to finish it after a predetermined time period, thereby achieving a constant time length of precharging of dummy cells regardless of long or short access intervals. This achieves a stable read operation.

Further, invention the present invention is not limited to these embodiments, but various variations and modifications may be made without departing from the scope of the present invention.

What is claimed is:

1. A semiconductor memory device, comprising:
   a plurality of bit line pairs, each of which includes a first bit line and a second bit line;
   a plurality of memory cells which are coupled to said first bit line, and include capacitors that store electric charge;
   a dummy cell which is coupled to said second bit line, and includes a dummy capacitor that is charged with a predetermined potential, said dummy capacitor being electrically connected to said second bit line during a period that overlaps a period during which one of the capacitors is electrically connected to said first bit line;
   a sense amplifier which amplifies a potential difference between said first bit line and said second bit line; and
   a control circuit which charges said dummy capacitor with the predetermined potential only for a fixed time period,
   wherein said fixed time period is constant regardless of intervals at which access is made to said bit line pairs.

2. The semiconductor memory device as claimed in claim 1, further comprising:
   a first timer circuit which generates an instruction signal at first predetermined intervals to order charging of said dummy cell with the predetermined potential; and
   a first address generating circuit which generates an address in response to the instruction signal from said first timer circuit,
   wherein said control circuit charges said dummy cell corresponding to said address with the predetermined potential in response to the instruction signal.

3. The semiconductor memory device as claimed in claim 2, wherein said control circuit immediately charges, in response to the instruction signal, said dummy cell corresponding to said address with the predetermined potential when said first timer circuit generates the instruction signal while said bit line pairs are not being accessed, and wherein said control circuit charges said dummy cell corresponding to said address with the predetermined potential after an end of access when said first timer circuit generates the instruction signal while said bit line pairs are being accessed.

4. The semiconductor memory device as claimed in claim 2, further comprising:
   a second timer circuit which generates an instruction signal at second predetermined intervals to order refreshing of said memory cells; and
   a second address generating circuit which generates an address of memory cells to be refreshed in response to the instruction signal from said second timer circuit.

5. The semiconductor memory device as claimed in claim 2, wherein said first timer circuit generates a refresh instruction signal at second predetermined intervals to order refreshing of said memory cells, said semiconductor memory device further comprising an address generating circuit which generates an address of memory cells to be refreshed in response to the refresh instruction signal from said first timer circuit.

6. The semiconductor memory device as claimed in claim 2, wherein said control circuit refreshes the memory cells at said address in addition to charging the dummy cell corresponding to said address with the predetermined potential in response to the instruction signal generated by said first timer circuit.

7. The semiconductor memory device as claimed in claim 6, wherein said bit line pairs are divided into a plurality of blocks, and said first address generating circuit generates successive addresses first for all word addresses in a given one of the blocks and then for a next one of the blocks.

8. The semiconductor memory device as claimed in claim 6, wherein said bit line pairs are divided into a plurality of blocks, and said first address generating circuit generates successive addresses first for a given word address in all the blocks and then for a next word address.

* * * * *